(12) United States Patent
Vaucher et al.

(10) Patent No.: US 6,489,818 B2
(45) Date of Patent: Dec. 3, 2002

(54) POWER ADAPTIVE FREQUENCY DIVIDER

(75) Inventors: Cicero Silveira Vaucher; Hubertus Hendrikus Martinus Vereijken, both of Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/846,600

(22) Filed: Apr. 30, 2001

(65) Prior Publication Data

US 2001/0035781 A1 Nov. 1, 2001

(30) Foreign Application Priority Data

May 1, 2000 (EP) .............................. 00201561

(51) Int. Cl.[7] ............................................. H03B 19/06
(52) U.S. Cl. .................... 327/117; 327/115; 377/47; 377/48
(58) Field of Search ................................ 327/114, 115, 327/116, 117, 119, 121, 156, 159; 377/47, 48

(56) References Cited

U.S. PATENT DOCUMENTS

| | | | | |
|---|---|---|---|---|
| 5,416,446 A | * | 5/1995 | Holler, Jr. et al. | 331/57 |
| 5,564,099 A | | 10/1996 | Yonekura et al. | 455/318 |
| 5,754,615 A | * | 5/1998 | Colavin | 377/47 |
| 5,815,694 A | * | 9/1998 | Ganfield et al. | 327/113 |
| 5,859,890 A | * | 1/1999 | Shurboff et al. | 377/48 |
| 6,009,139 A | * | 12/1999 | Austin et al. | 377/47 |

OTHER PUBLICATIONS

Kitada Yoshitaka, "Prescaler Circuit", May 1983, Abstracts of Japan.

* cited by examiner

Primary Examiner—Timothy P. Callahan
Assistant Examiner—An T. Luu
(74) Attorney, Agent, or Firm—Steven R. Biren

(57) ABSTRACT

The power consumption of a frequency-divider can effectively be reduced when the frequency of the input signal varies by more than the division factor of a divider cell in the frequency divider. A low frequency input signal requires a lower division factor, and a divider cell in the frequency divider can be bypassed and switched off to obtain this lower division factor, thereby reducing the power consumption.

18 Claims, 4 Drawing Sheets

POWER ADAPTIVE FREQUENCY DIVIDER

BACKGROUND OF THE INVENTION

The present invention relates to a frequency divider having an adjustable division factor, including an input and a divider cell with an input for accepting a first signal at a first frequency and an output for outputting a second signal at a second frequency, and a power control means associated with the frequency divider to adjust a bias current of the divider cell.

Such a frequency divider is known from Application Note 4 'Using the PE3291/92 in CDMA Applications' from Peregrine Semiconductor Corporation. The PE3291 is a fractional-N PLL integrated frequency synthesizer and contains two dividers: a 16/17 modulus prescaler (PLL1) and a 32/33 modulus prescaler (PLL2) with variable division factors. The PE 3291 provides two inputs VDD1 and VDD2 which allow external control of the bias level of the prescaler PLL1 and the prescaler PLL2. When a prescaler is used at a reduced speed, the bias level can be reduced. The prescaler is slower at lower bias levels, but a bias level can be chosen such that the speed is adequate for the operation at a reduced input frequency. In this way the power consumption can be reduced in relation to the reduced input frequency.

A disadvantage of the known frequency divider is that the power consumption cannot be reduced substantially.

SUMMARY OF THE INVENTION

It is an object of the present invention to provide a circuit where the power consumption of the frequency divider can be reduced.

To achieve this, the frequency divider is characterized in that the frequency divider includes a multiplexing means with a first input for receiving the second signal with the second frequency and a second input for receiving a third signal with a third frequency and an output for outputting either the second signal or the third signal, where the first input of the multiplexing means is connected to the output of the divider cell and in that the power control means is operative to reduce the bias current of the divider cell to zero when the first input of the multiplexing means is deselected.

Frequency dividers having programmable division factors are often employed in a system with different input frequencies. The programmable division factor enables the system to divide the input frequency to yield a frequency that is within a prescribed operating range.

An example of this is the use of a divider with a programmable division factor in a Phase Locked Loop (PLL). The input frequency varies, and the frequency divider is used to divide the input frequency to a frequency range that is required for the phase detector to work properly.

If the input frequency of the frequency divider is reduced, the division factor must be reduced.

When the division factor is reduced, some divider cells of the frequency divider are no longer needed to divide the signal. These cells are then deselected by a multiplexer and the multiplexer obtains its input signal from another point in the frequency divider. Since the output of the divider cell is no longer used, the bias current of the divider cell can be reduced to zero, in effect switching the divider cell off and reducing the power consumption of this divider cell to zero. The power consumption of the frequency divider is thus dependent on the division factor of the frequency divider.

In the GSM mobile radio system two frequencies are employed, e.g. 900 MHz and 1800 MHz.

When a mobile phone is operating in the 900 MHz band, the frequency divider in the PLL generating the carrier frequency must divide the VCO frequency by a factor of 2 less than when the mobile phone is operating in the 1800 MHz band. If the frequency divider contains a divider cell of two that divides the signal coming from the input, this divider is not needed when working in the 900 MHz band. The signal does not need to pass through this divider cell and, consequently, the divider cell can be switched off.

An embodiment of the present invention is characterized in that the second input of the multiplexing means is connected to the input of the divider cell.

By selecting the input of the divider cell instead of the output of the divider cell, the input signal will appear undivided on the output of the multiplexer. By switching the multiplexer, the division factor of the combination of the multiplexer and the divider cell can be switched between 1 and the division factor of the divider cell. The multiplexer provides the frequency divider with the option to bypass the divider cell. Since the divider cell is not used, it is possible to reduce the bias of the divider cell to zero and thus reduce the power consumption of the frequency divider.

A further embodiment of the present invention is characterized in that the frequency divider includes a further multiplexing means, which is referred to as the second multiplexing means, with a first input and a second input and an output, where the first input of the second multiplexing means is connected to the output of the second divider cell and where the second input of the second multiplexing means is connected to the second input of the multiplexing means and in that the second power control means is operative to reduce the bias current of the second divider cell to zero when the first input of the second multiplexing means is deselected.

A further embodiment of the present invention is characterized in that at least one power control means associated to the divider cell is operative to adjust the bias current of the associated divider cell proportionally to an input frequency of the divider cell when the first input of the multiplexing means connected to the output of that divider cell is selected.

When a divider cell is not operating at the maximum operating frequency, the bias current of this divider cell can be reduced, thereby reducing the effective speed of the divider cell. The power dissipation can be optimized by adjusting the bias current to a level just above the level where the operation of the divider would be adversely affected. In this way a gradual reduction of power dissipation can be achieved between the power reduction steps obtained by bypassing and switching off entire divider cells when the operating frequency is reduced.

A further embodiment of the present invention is characterized in that a microprocessor is operative to control the VCO and at least one of the power control means of the frequency divider.

The microprocessor controls the VCO and, therefore, knows what the operating frequency of the VCO is and also knows what the required division factor of the frequency divider is. Based on the required division factor, the microprocessor decides which divider cells are not needed, switches those divider cells off, and switches the associated multiplexers so that these divider cells are bypassed. Based on the operating frequency, the microprocessor can also reduce the bias current for the remaining, operative, divider cells to further optimize the power consumption of the frequency divider.

A further embodiment of the present invention is characterized in that a third power control means is operative to adjust the amplifier bias current of the input amplifier dependent of an input frequency of the input amplifier.

BRIEF DESCRIPTION OF THE DRAWING

The present invention will now be explained with reference to the drawing, in which.

DESCRIPTION OF THE PREFERRED EMBODIMENTS

Figure 1:
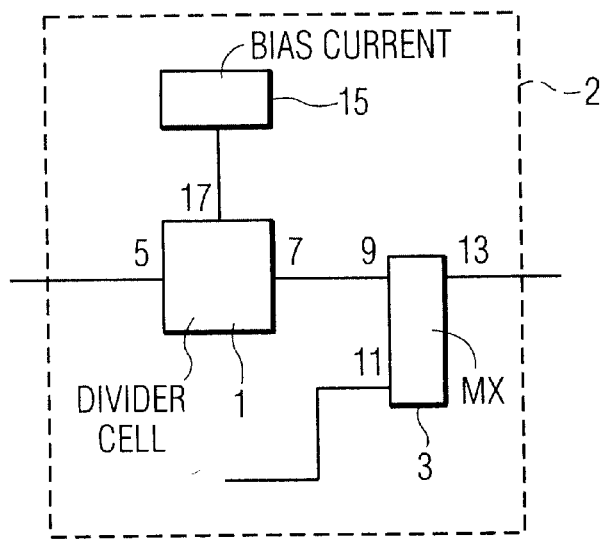
FIG. 1 shows a frequency divider including a divider cell and a multiplexer and a bias current supply according to the invention.

A frequency divider 2 according to FIG. 1 includes a divider cell 1 with an input 5 and an output 7. The output 7 is connected to a first input 9 of a multiplexer 3. The multiplexer 3 has an output 13. The divider cell 1 has a bias control input 17, which is connected to a bias current controller 15. When the multiplexer 3 deselects its first input 9, the output 7 of the divider cell is not used by the circuit. Since the only purpose of the divider cell 1 is to divide an input signal that is present on the input 5 of the divider cell and to make the resulting divided signal available to other parts of the divider via the multiplexer, it is no longer useful for the divider cell to divide the input signal. As a consequence, the divider cell 1 can be switched off by reducing the bias current for the divider cell to zero, which is supplied to the divider cell 1 from the bias current supply 15 via the bias current input 17. The multiplexer 3 can select another signal via a second input 11 and make this signal available on its output 13 when the output 7 of the divider cell 1 is deselected.

Figure 2:
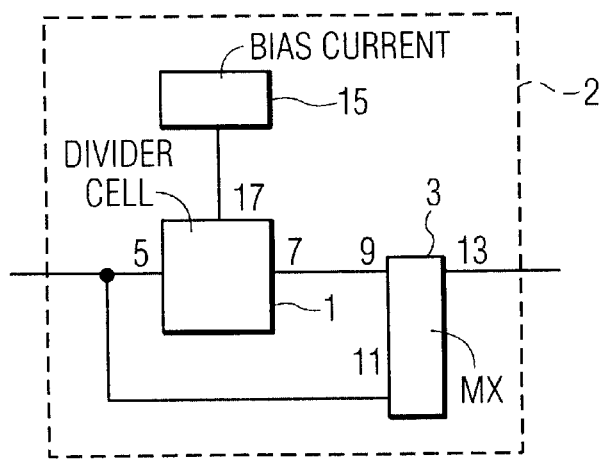
FIG. 2 shows a frequency divider including a divider cell and a multiplexer and a bias current supply in another configuration according to the invention.

Another configuration of the frequency divider 2 is shown in FIG. 2.

Here the second input 11 of the multiplexer 3 is connected to the input 5 of the divider cell 1.

When the multiplexer 3 selects the output 7 of the divider cell 1, the divided input signal is made available on the output 13 of the multiplexer 3.

When the multiplexer 3 deselects the output 7, the divider cell can be switched off by reducing the bias current supplied by the bias current controller 15 to zero. The signal that is made available on the output 13 of the multiplexer 3 is in this case the input signal of the divider cell 1. The multiplexer 3 makes it possible to switch the effective division factor between the input 5 of the divider cell and the output 13 of the multiplexer 3 between 1, when the input signal is directly selected by the multiplexer 3, and the division factor of the divider cell, when the output 7 of the divider cell is selected by the multiplexer 3.

Figure 3:
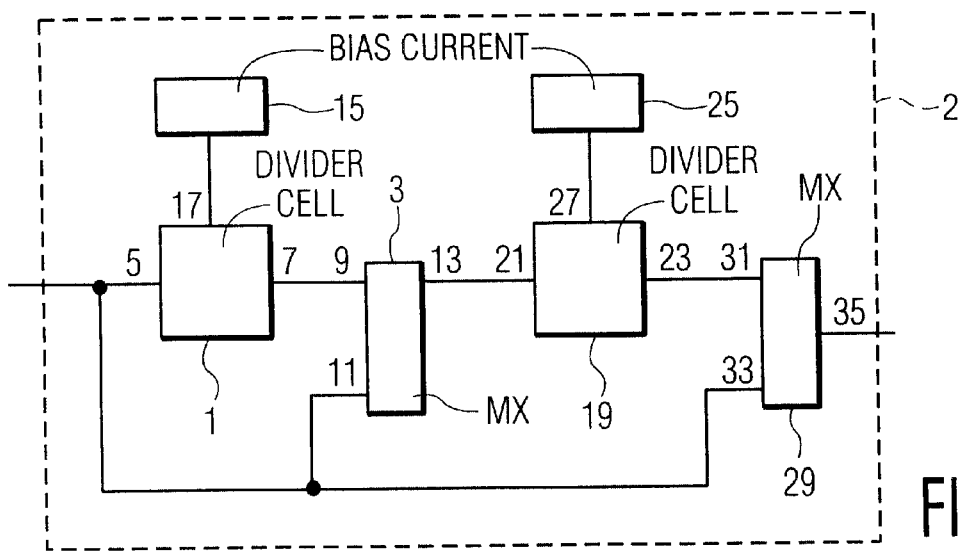
FIG. 3 shows a frequency divider including multiple divider cells, multiplexers, and bias current supplies according to the invention.

A frequency divider including more divider cells, multiplexers, and bias current controllers is shown in FIG. 3.

Here an input 21 of a second divider cell 19 is connected to output 13 of the first multiplexer. The second divider cell 19 also includes a bias control input 27 which is connected to a second bias current supply 25. An output 23 of the second divider cell 19 is connected to a first input 31 of a second multiplexer 29. This second multiplexer 29 has an output 35 and a second input 33. This second input 33 is connected to the second input 11 of the first multiplexer 3. When the second input 33 of the second multiplexer 29 is selected, the input signal on the input 5 of the first divider cell is made available on the output 35 of the second multiplexer, realizing an effective division factor between the input 5 and the output 35 of 1. Both divider cells 1 and 19 can be switched off.

When the first input 31 of the second multiplexer 29 is selected, the input signal is at least divided by the second divider cell 19, and, depending on the state of multiplexer 3, the input signal is also divided by the first divider cell 1. If the first divider cell 1 is deselected by the first multiplexer 3, the effective division factor is the division factor of the second divider cell 19, and the bias current that is supplied to the first divider cell 1 by the bias current controller 15 can be reduced to zero. If the first divider cell 1 is selected by the first multiplexer 3, the effective division factor is the division factor of the first divider cell times the division factor of the second divider cell, and both divider cells 1 and 19 must be supplied with bias current by their corresponding bias current controllers 15 and 25.

When the first divider cell 1 is deselected and the second divider cell 19 is operated below its maximum operating frequency, the bias current supplied to the second divider cell 19 by the second bias current controller 25 is reduced, thereby reducing the power consumption of the frequency divider 2. When the first divider cell 1 is bypassed, the second divider cell 19 effectively becomes the first divider cell which processes the input signal present on the input 5 of the first divider cell. Therefore, the operating frequency which the second divider cell 19 is designed for is the highest for the divider cells that remain operative, and the bias current is accordingly relatively high compared to the other active divider cells. A reduction of this relatively high bias current is an effective way to reduce power consumption by the frequency divider 2.

It also results in an optimal and more gradual reduction of power consumption compared to the situation where divider cells that are no longer required are switched off, because in that situation the divider cell 19 is being supplied with a large bias current to ensure adequate operation of the divider cell 19 at its highest operating frequency, even when an input signal with a much lower frequency is actually being divided. In the situation where a gradual reduction of the bias current of the second divider cell 19 is being used, the power consumption is always close to optimal while in the situation where the divider cells are only switched off, the optimum is only reached when the first divider cell 1 is just switched off, i.e. the second divider cell 19 is operating close to its maximum operating frequency.

Figure 4:
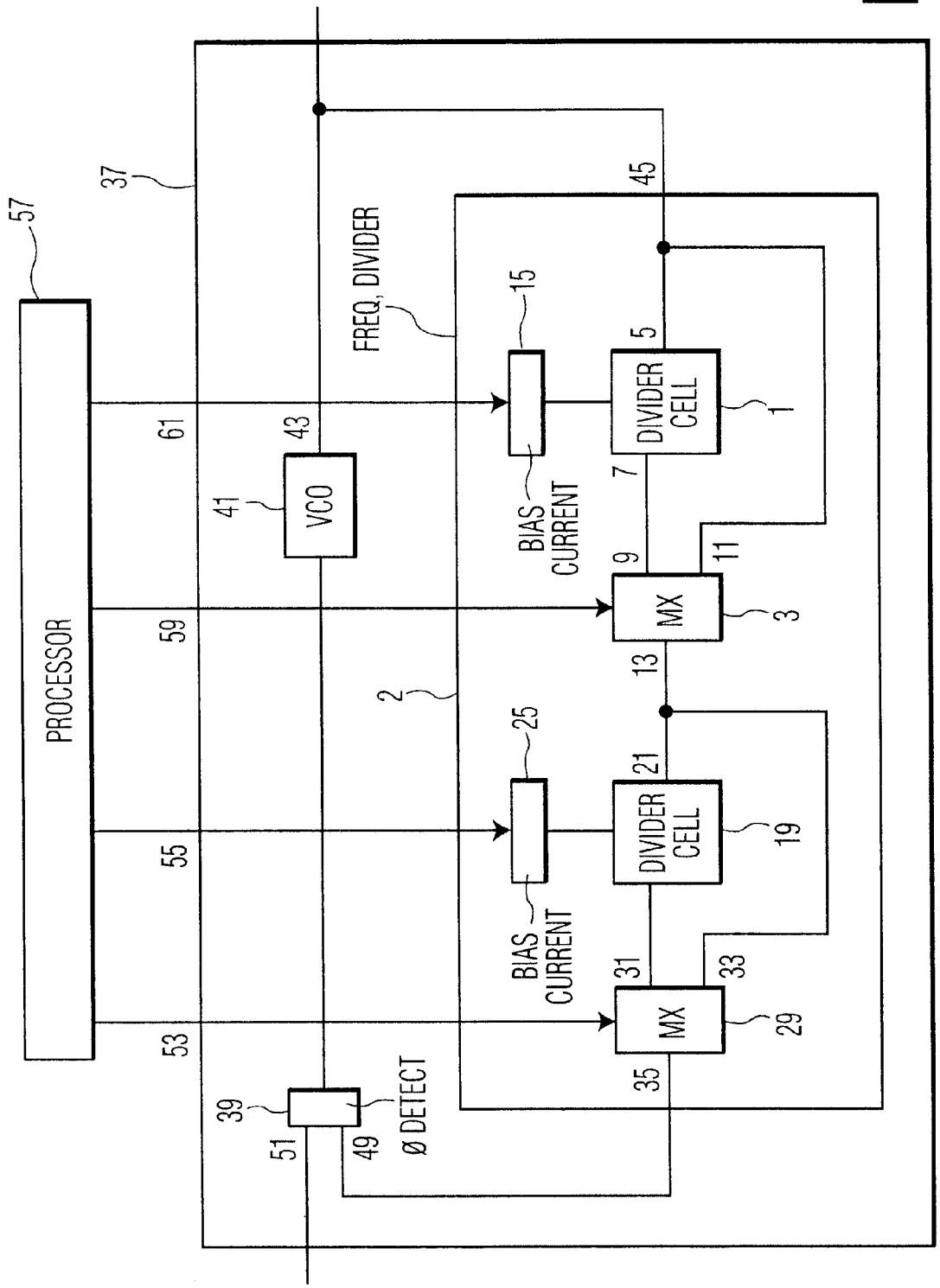
FIG. 4 shows a Phase Locked Loop according to the invention.

In FIG. 4 a Phase Locked Loop (PLL) 37 is shown, which is controlled by a processor 57 and includes a frequency divider 2 according to the present invention.

The PLL 37 includes a phase detector 39, which detects a phase difference between a reference signal on a reference input 51 and a divided VCO output signal on a compare input 49. The phase detector is connected to a Voltage Controlled Oscillator (VCO) 41 and provides the VCO 41 with information about the phase difference between the two input signals. Based on this information, the VCO 41 will generate an output signal which is made available on an output 43 of the VCO 41. The output 43 of the VCO is connected to an input 45 of the frequency divider 2. The input 45 of the frequency divider is connected to the input 5 of the first divider cell of the frequency divider 2.

The VCO output signal on the output 43 of the VCO 41 is thus applied to the input 45 of the frequency divider 2 and, consequently, divided by the frequency divider 2, which results in a divided VCO output signal on the output 35 of the frequency divider 2.

To change the operating frequency of the PLL 37, the division factor of the frequency divider 2 must be altered. This is achieved by controlling the multiplexers 3, 29 in the frequency divider 2 by signals provided by a processor, effectively allowing the VCO output signal to bypass the deselected divider cells. The processor thereby effectively controls the output frequency of the VCO 43 and thus of the PLL.

Since the processor 57 controls the multiplexers 3, 29, it can also determine which divider cells can be switched off. Also, because the processor 57 knows the operating frequency of the PLL 37 and the state of the multiplexers 3, 29, it can determine which divider cell 1, 19 is operating and at what operating frequency. Therefore, the processor is able to determine a corresponding bias current that is appropriate for the divider cells. The processor 57 is connected to the bias current control 15 via a control port 61 and to the bias control 25 via a control port 55. Via these control ports 55, 61 the processor 57 can either completely switch off the bias current for the corresponding divider cell 1, 19, or reduce the bias current to suit the operating frequency of the corresponding divider cell 1, 19.

Figure 5:
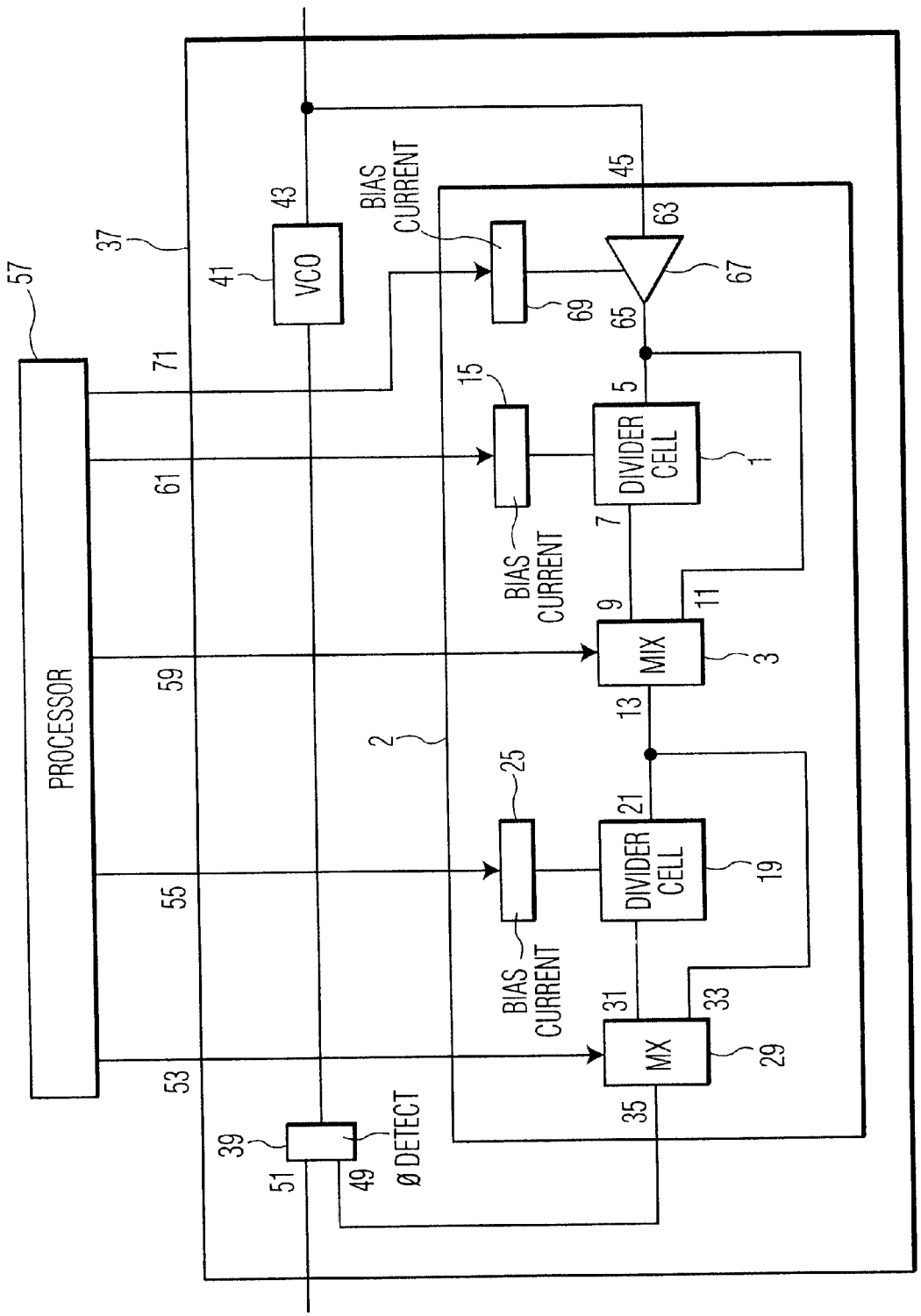
FIG. 5 shows the use of an amplifier with an adjustable bias current in the frequency divider.

FIG. 5 shows the PLL 37, which includes an amplifier 67 with an input 63 connected to the input 45 of the frequency divider 2, and an output 65 connected to the input 5 of the first divider cell 1. This amplifier 67 amplifies the input signal, in this example the VCO output signal, and thus allows the frequency divider 2 to operate with lower level signals than of the amplifier were not present. The bias current of the amplifier 67 is dependent on the gain factor of the amplifier 67. When a low gain is sufficient to obtain an adequate signal level of the input signal for operation of the divider cell, the bias current of the amplifier 67 can be reduced. In this way it is possible to achieve a reduction of the power consumption of the frequency divider 2. The information about the signal level of the input signal of the divider cell 1, 19 can be obtained in several ways. For example, a level meter can be used to measure the signal level, and adjust the amplification accordingly, similar to an automatic gain control circuit. In FIG. 5 the information is determined by the processor based on the operating frequency of the VCO 41, and the known characteristics of the VCO 41. The characteristics of a VCO often show a variation of output signal level, which depends on the operating frequency. The processor 57 can contain a lookup table or can use a mathematical relationship to determine what the expected signal level on the output 43 of the VCO 41 is, based on the actual operating frequency. The processor 57 can also determine what the required signal level of the various divider cells 1, 19 in the frequency divider 2 is, which can be frequency and divider cell dependent, and accordingly adjust the gain and bias current of the amplifier 67. This way the power consumption can be optimized depending on which divider cell is processing the signal on the output 65 of the amplifier 67.

Figure 6:
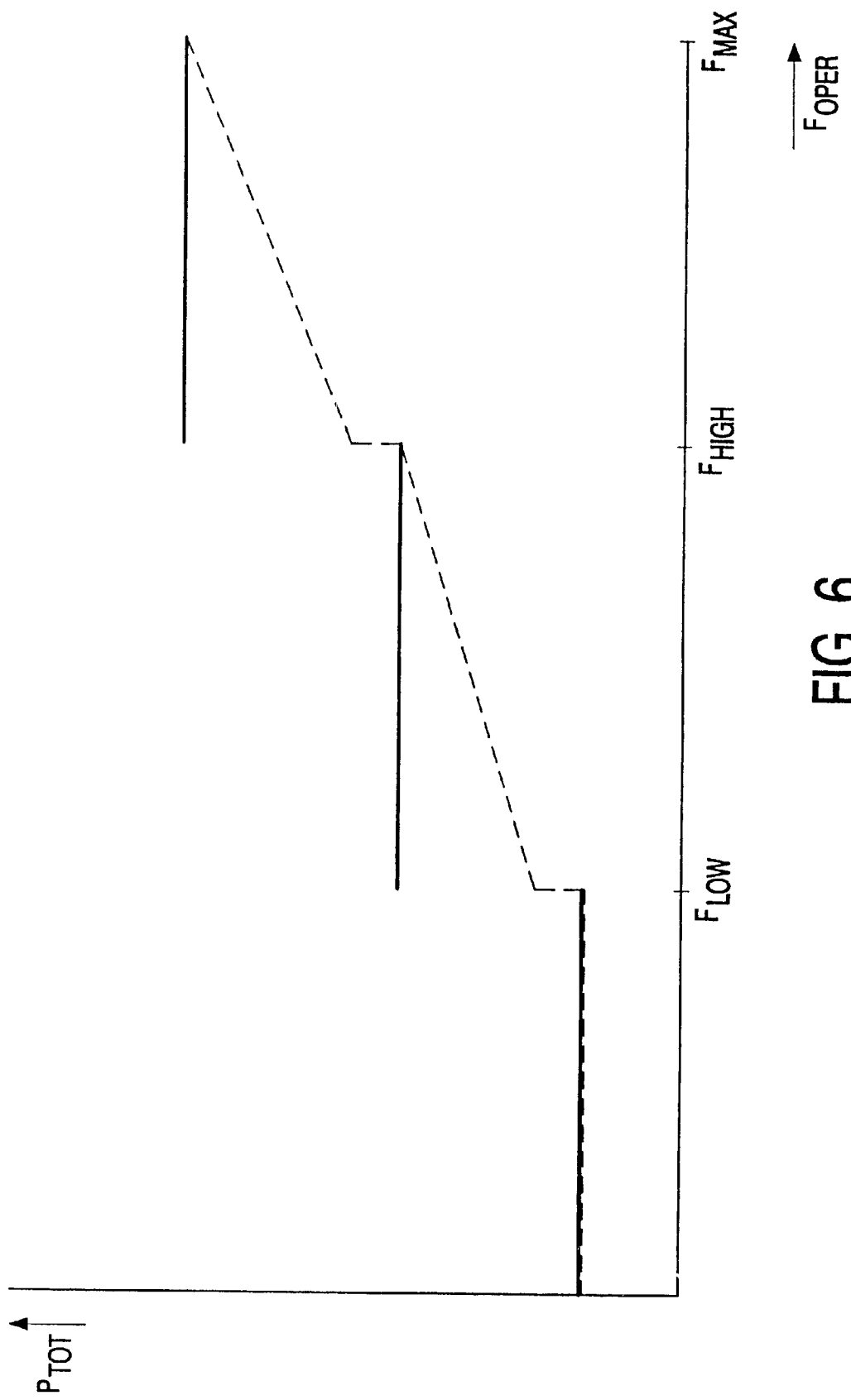
FIG. 6 shows the power consumption of the frequency divider.

FIG. 6 shows the power consumption of the frequency divider.

On the horizontal axis the operating frequency $F_{oper}$ of the frequency divider is shown.

On the vertical axis the total power consumption $P_{tot}$ of the frequency divider is shown.

The solid lines in FIG. 6 show the effect of switching off a divider cell in the frequency divider. At the maximum frequency $F_{max}$ all cells have to be active and able to handle the maximum incoming frequencies. When the operating frequency $F_{oper}$ of the input signal is reduced to $F_{high}$, the first divider cell in the frequency divider is no longer needed and can be deselected or bypassed and switched off. By switching the first divider cell off, a drop of the power dissipation is achieved. When the input frequency is reduced even further, the next divider cell can be deselected and switched off, effectively reducing the power consumption even more.

The dotted line in FIG. 6 shows the effect of, in addition to switching appropriate divider cells off, reducing the bias current of a divider cell in relation to the operating frequency $F_{oper}$ of the divider cell.

When the frequency of the input signal is Fmax, the first divider cell must operate at its highest frequency and the bias current is accordingly high. Together with the input frequency the bias current can be reduced as well. When the operating frequency $F_{oper}$ is slightly higher than $F_{high}$, the first divider cell is still operating and, therefore, still needs a certain amount of bias current. At frequency $F_{high}$, the first divider cell can be deselected and switched off which results in a drop of the bias current. In the frequency range between $F_{high}$ and $F_{low}$ the second divider cell operates at the highest frequency in the system and its bias current can now advantageously be reduced in relation to the operating frequency $F_{oper}$. This results in a reduction of the bias current along the dotted line, until $F_{low}$ is reached. At this point the second divider cell can also be switched off, resulting in a drop of the power consumption of the frequency divider.

What is claimed is:

1. A frequency divider having an adjustable division factor, comprising: an input, a divider cell with an input for accepting a first signal with a first frequency and an output for outputting a second signal with a second frequency, and a power control means associated with the frequency divider to adjust a bias current of the divider cell, characterized in that the frequency divider includes a multiplexing means with a first input for receiving the second signal with the second frequency and a second input for receiving a third signal with a third frequency and an output for outputting either the second signal or the third signal, where the first input of the multiplexing means is connected to the output of the divider cell and in that the power control means is operative to reduce the bias current of the divider cell to zero when the first input of the multiplexing means is deselected.

2. A frequency divider as claimed in claim 1, characterized in that the second input of the multiplexing means is connected to the input of the divider cell.

3. A frequency divider as claimed in claim 1, comprising a second divider cell, having an input and an output, characterized in that the input of the second divider cell is connected to the output of the multiplexing means.

4. A frequency divider as claimed in claim 3 comprising: a second power control means associated with the second divider cell, to adjust a bias current of the second divider cell, characterized in that the frequency divider includes a second multiplexing means, having a first input and a second input and an output, where the first input of the second multiplexing means is connected to the output of the second divider cell and where the second input of the second multiplexing means is connected to the second input of the multiplexing means, and in that the second power control means is operative to reduce the bias current of the second divider cell to zero when the first input of the second multiplexing means is deselected.

5. A frequency divider as claimed in claim 1, characterized in that the power control means associated with the divider cell is operative to adjust the bias current of the associated divider cell proportionally to an input frequency of the divider cell when the first input of the multiplexing means connected to the output of that divider cell is selected.

6. A frequency divider as claimed in claim 1, comprising: an input amplifier with an amplifier bias current and an input connected to the input of the frequency divider, and an output connected to the input of the divider cell, characterized in that a further power control means is operative to adjust the amplifier bias current of the input amplifier dependent on an input frequency of the input amplifier.

7. A frequency divider as claimed in claim 1, characterized in that the power control means is connected to a processor, which processor is operative to adjust the power control means when the associated divider cell is deselected.

8. A phase locked loop comprising:
 a phase detector having a first input for receiving a reference signal and having a second input and an output,
 a frequency divider as claimed in claim 2,
 a voltage controlled oscillator having an input coupled to the output of the phase detector and having an output coupled to the input of the frequency divider, and
 means coupling the second input of the phase detector to the output of the multiplexing means.

9. A Phase Locked Loop as claimed in claim 1, further comprising;
 a microprocessor coupled to the phase locked loop and operative to control the VCO and the power control means of the frequency divider.

10. A frequency divider as claimed in claim 3 further comprising;
 an input amplifier with an amplifier bias current and an input connected to the input of the frequency divider, and an output connected to the input of the divider cell,
 characterized in that a further power control means is operative to adjust the amplifier bias current of the input amplifier dependent on an input frequency of the input amplifier.

11. A frequency divider as claimed in claim 3 further comprising;
 second power control means associated with the second divider cell to adjust a bias current thereof, wherein
 at least one power control means is coupled to a processor which is operative to adjust the at least one power control means when the associated divider cell is deselected.

12. A frequency divider as claimed in claim 1 wherein the second input of the multiplexing means is connected to the input of the divider cell so that the third signal with the third frequency is the first signal with the first frequency.

13. A frequency divider as claimed in claim 12 further comprising:
 a second divider cell having an input coupled to the output of the multiplexing means,
 second power control means coupled to the second divider cell to adjust the bias current thereof,
 second multiplexing means having a first input coupled to an output of the second divider cell, a second input coupled to the second input of the multiplexing means, and wherein the second power control means is operative to adjust the bias current of the second divider cell as a function of the frequency of the selected input signal to said second multiplexing means.

14. A frequency divider as claimed in claim 12 further comprising:
 a second divider cell having an input coupled to the output of the multiplexing means,
 second power control means coupled to the second divider cell to adjust the bias current thereof,
 second multiplexing means having a first input coupled to an output of the second divider cell and a second input coupled to the second input of the multiplexing means, wherein the second power control means is operative to adjust the bias current of the second divider cell,
 characterized in that the power control means associated with a divider cell is operative to adjust the bias current of the associated divider cell proportionally to an input frequency of the divider cell.

15. A power adaptive adjustable frequency divider comprising:
 a divider cell having an input for accepting a first signal at a first frequency and an output for outputting a second signal at a second frequency, a power control means coupled to the frequency divider to adjust a bias current of the divider cell, a multiplexing means having a first input for receiving the second signal at the second frequency and a second signal input, and an output for outputting either the second signal or a signal received at its second signal input, and wherein the power control means is operative to adjust the bias current of the divider cell as a function of the frequency of the first signal at the input of the divider cell in a manner so as to reduce the power consumed by the frequency divider.

16. A power adaptive adjustable frequency divider as claimed in claim 15 wherein the power control means is operative to reduce the bias current of the divider cell to zero when the first input of the multiplexing means is deselected.

17. A power adaptive adjustable frequency divider as claimed in claim 15 further comprising;

a second divider cell having an input coupled to the output of the multiplexing means, second power control means coupled to the second divider cell to adjust the bias current thereof, second multiplexing means having a first input coupled to an output of the second divider cell, a second input coupled to the second input of the multiplexing means, and wherein the second power control means is operative to adjust the bias current of the second divider cell as a function of the frequency of the selected input signal to said second multiplexing means.

18. A power adaptive adjustable frequency divider as claimed in claim 15 further comprising;

a second divider cell having an input coupled to the output of the multiplexing means, second power control means coupled to the second divider cell to adjust the bias current thereof, second multiplexing means having a first input coupled to an output of the second divider cell, a second input coupled to the second input of the multiplexing means, and wherein the second power control means is operative to adjust the bias current of the second divider cell as a function of the frequency of the selected input signal to said second multiplexing means, wherein at least one of said power control means is operative to adjust the bias current of the associated divider cell proportionally to an input frequency of the divider cell.

* * * * *